United States Patent [19]
Allen et al.

[11] Patent Number: 5,296,118
[45] Date of Patent: *Mar. 22, 1994

[54] ROBOTIC APPARATUS FOR AND METHOD OF MANUFACTURING DATA STORAGE DISKS

[75] Inventors: Ronald Allen, San Jose; Peter S. Bae, Sunnyvale; Steven Miura, San Jose, all of Calif.

[73] Assignee: Komag, Incorporated, Milpitas, Calif.

[*] Notice: The portion of the term of this patent subsequent to Feb. 18, 2009 has been disclaimed.

[21] Appl. No.: 837,831

[22] Filed: Feb. 18, 1992

Related U.S. Application Data

[62] Division of Ser. No. 559,357, Jul. 30, 1990, Pat. No. 5,089,110.

[51] Int. Cl.$^5$ ............ C23C 14/22; B66C 23/00
[52] U.S. Cl. ............ 204/192.12; 204/298.27; 204/298.15; 414/744.3; 414/744.7; 427/128; 118/503
[58] Field of Search ........... 204/192.12, 192.15, 204/192.2, 298.15, 298.25, 298.26, 298.27; 118/500, 503; 414/222, 417, 744.3, 744.7; 427/128, 131, 569

[56] References Cited

U.S. PATENT DOCUMENTS

| | | | |
|---|---|---|---|
| 4,589,369 | 5/1986 | Mahler | 118/500 |
| 4,595,481 | 6/1986 | Allen et al. | 204/298 |
| 4,634,512 | 1/1987 | Allen et al. | 204/298 |
| 4,735,540 | 4/1988 | Allen et al. | 414/222 |
| 5,089,110 | 2/1992 | Allen et al. | 204/298.15 |

FOREIGN PATENT DOCUMENTS 2156861A 10/1986 United Kingdom .

Primary Examiner—Nam Nguyen
Attorney, Agent, or Firm—Skjerven, Morrill, MacPherson, Franklin & Friel

[57] ABSTRACT

A unitary one-piece plug is insertable into a magnetic data storage blank disk by a robot arm. The plug has a relatively large flange portion and grip knob on one end, a smaller diameter entry portion on the other end which passes through a central aperture in the disk. A cylindrical portion of less diameter than the entry portion forms a circumferential slot which rests on a bottom edge of the aperture in a vertically oriented disk when the plug is left in the disk aperture and the disk is mounted in a disk carrier for disk processing. The plug flange then blocks communication from one side to the other side of the disk. When the plug is lifted in the disk aperture by a robot arm the plug slot is captured by the upper edge of the disk aperture and permits the robot arm to move the disk with its plug to and from a disk cassette. Since there is no unplugging and unplugging of plug halves and a more simple robot arrangement is possible, the generation of particles which can cause magnetic defects in the manufactured magnetic media disk is minimized.

9 Claims, 5 Drawing Sheets

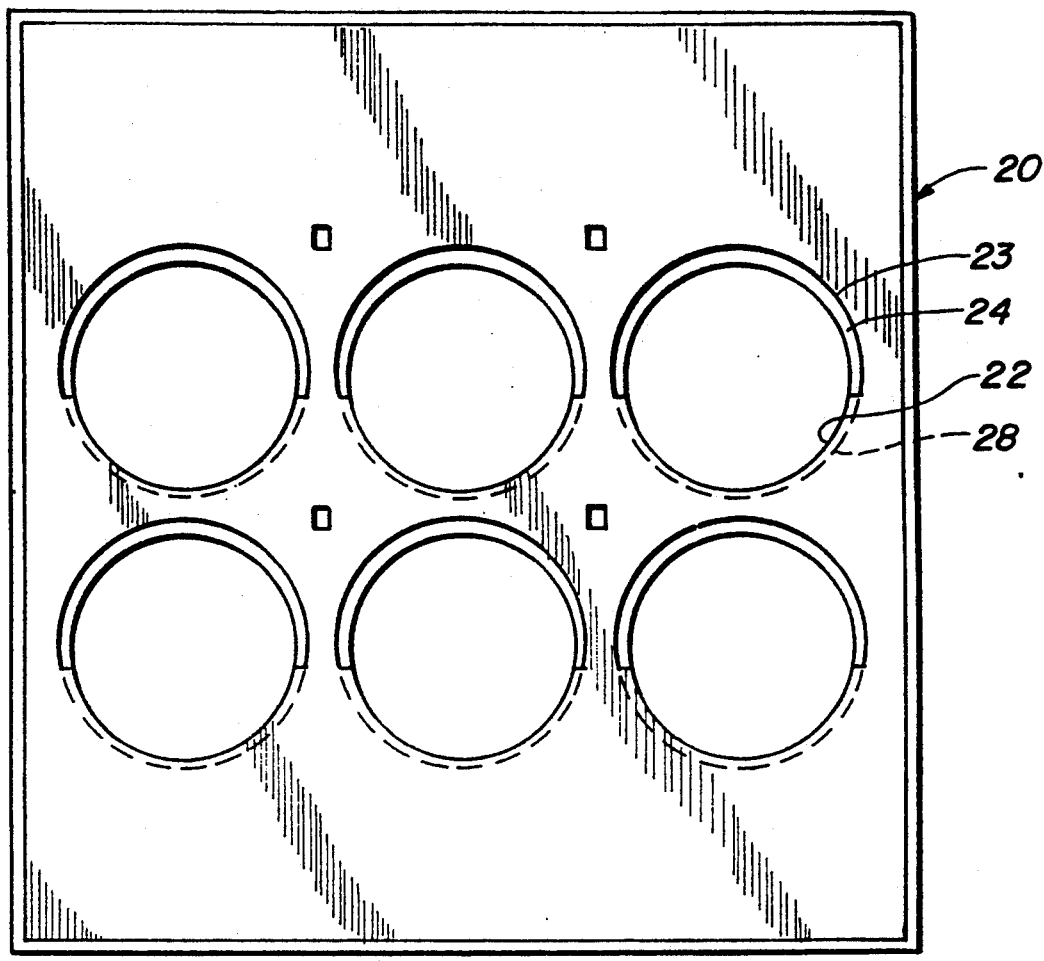
FIG._1
(PRIOR ART)
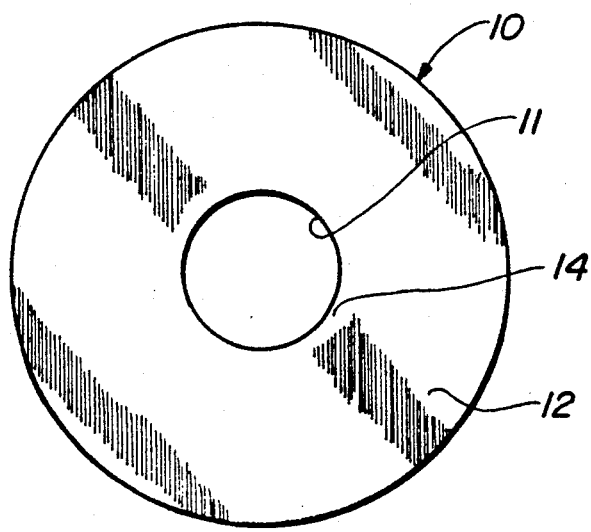
FIG._2
(PRIOR ART)
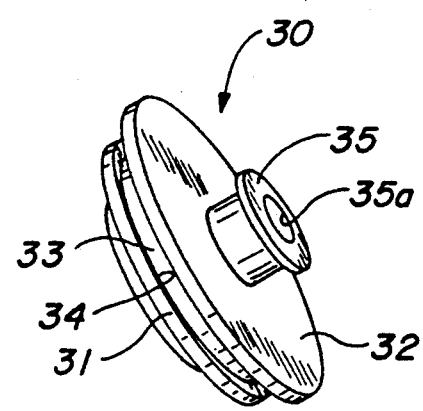
FIG._3

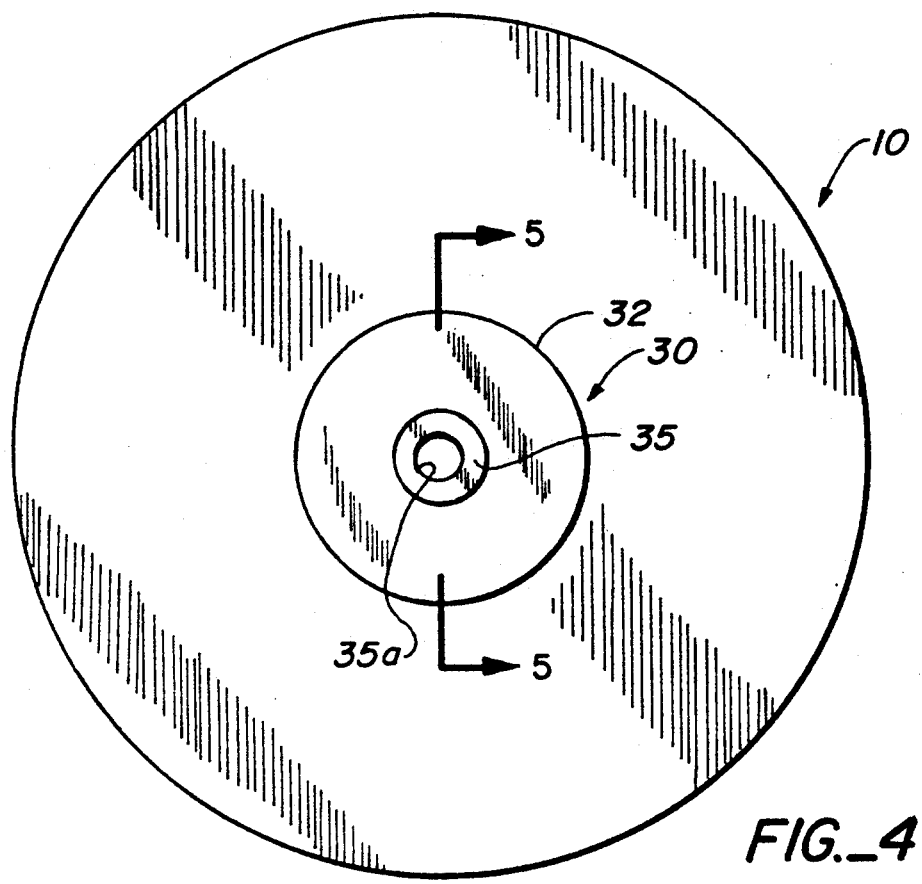
FIG._4
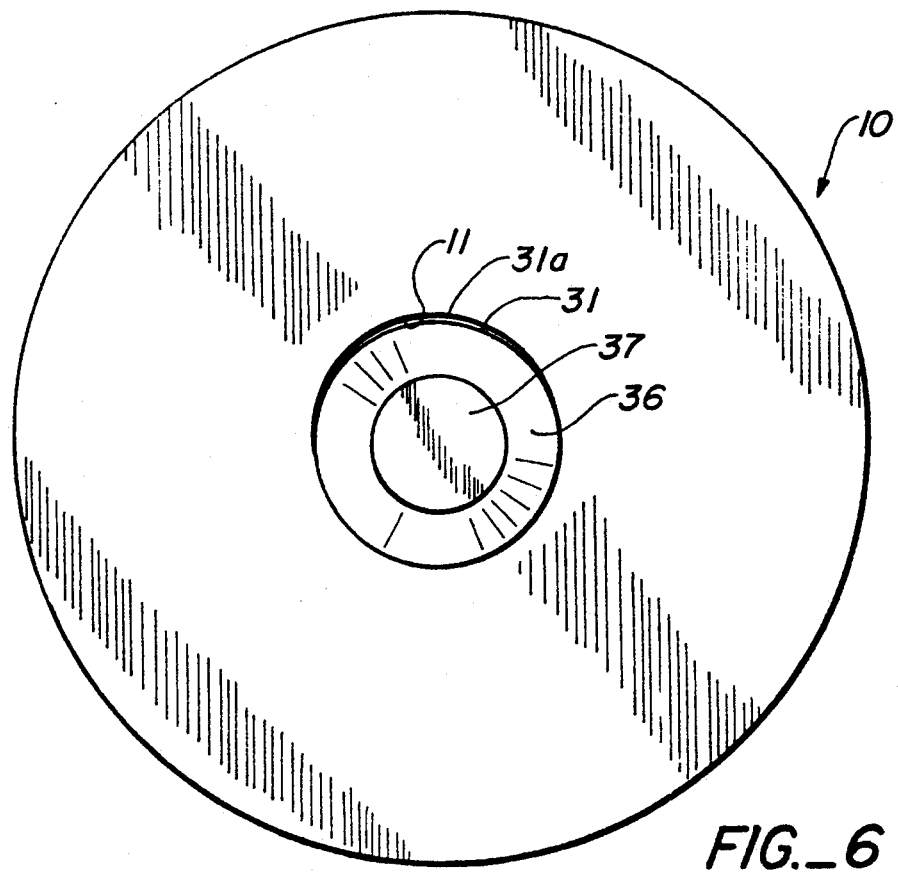
FIG._6

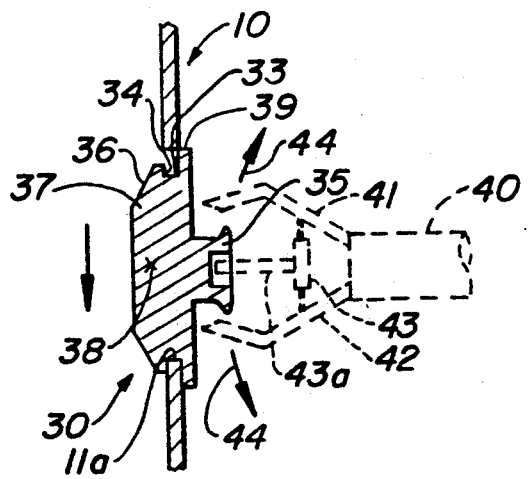
FIG._5
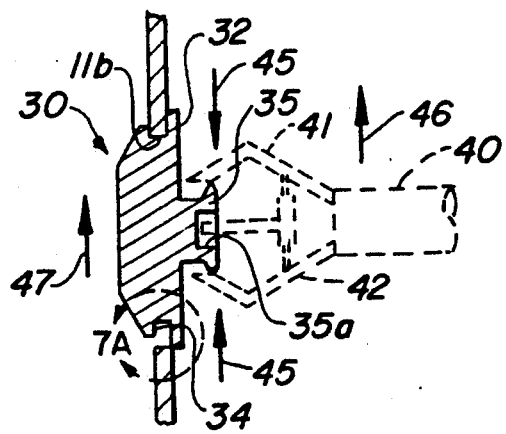
FIG._7
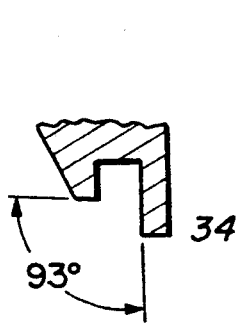
FIG._7A
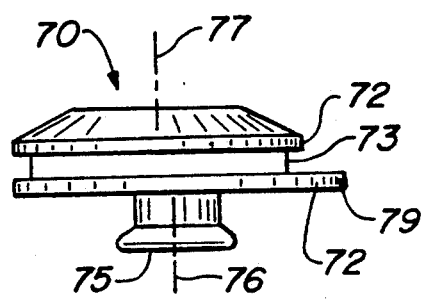
FIG._11
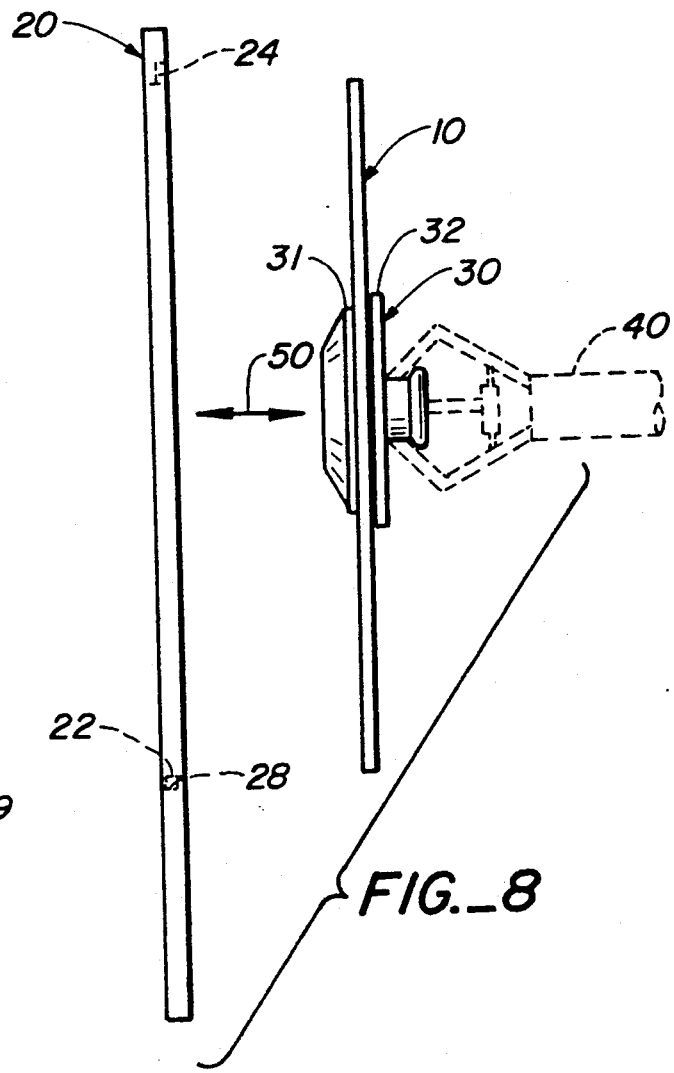
FIG._8

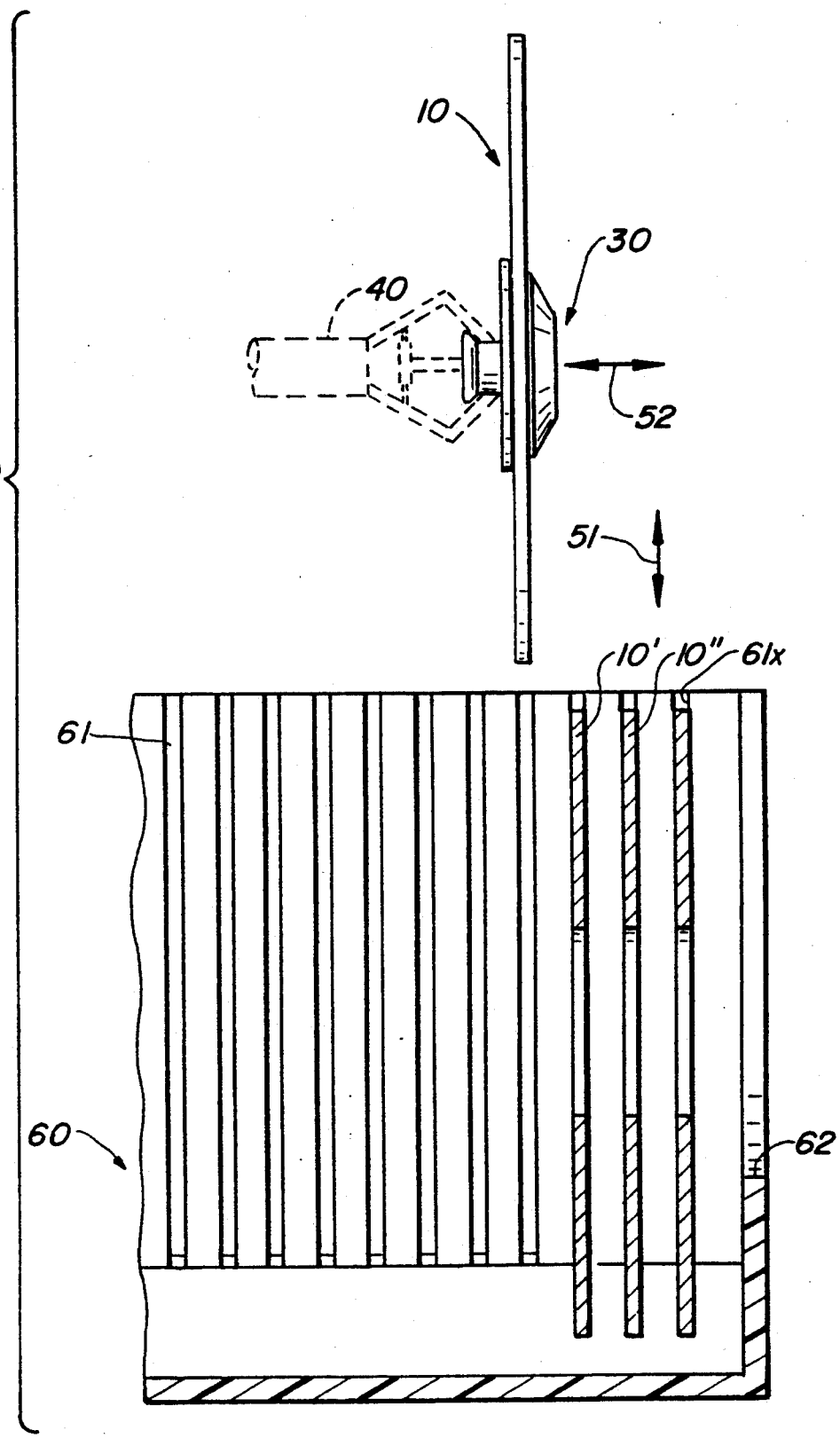

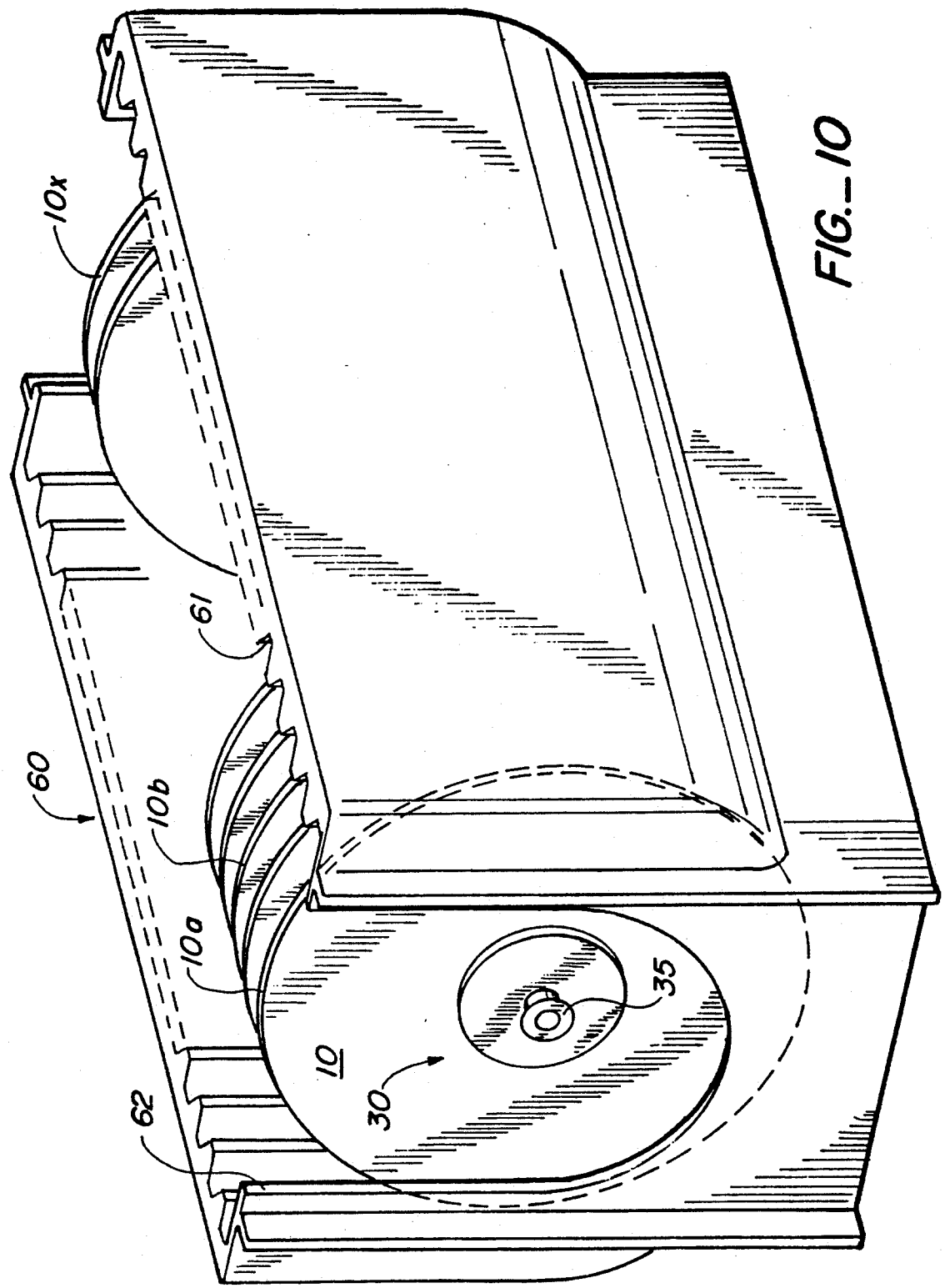
FIG._10

ROBOTIC APPARATUS FOR AND METHOD OF MANUFACTURING DATA STORAGE DISKS

This application is a division of application Ser. No. 07/559,357, filed Jul. 30, 1990, now U.S. Pat. No. 5,089,110 issued Feb. 18, 1992.

BACKGROUND OF THE INVENTION

1. Field of the Invention

This invention relates to magnetic data storage disk manufacturing and in particular to an apertured disk, a plug for use with the disk and a disk carrier, the plug preventing passage of sputtered magnetic material through the aperture during disk manufacture.

2. Material Art

The manufacture of magnetic disks is broadly described in U.S. Pat. No. 4,634,512, an invention of R. Allen and Tu Chen. In that patent and U.S. Pat. No. 4,595,481 the use of multi-part plugs is disclosed for plugging the disk operation during disk manufacture. The plug is of multi-piece construction where two main body parts are pushed together through the disk aperture from opposite sides of the disks. The plug body parts are held by a spring (U.S. Pat. No. 4,595,481) or by a magnet in one of the body parts (U.S. Pat. No. 4,634,512). The disk carrier has a series of apertures which are sized and grooved to receive a number of apertured disk blanks for plasma application of magnetic media, such as cobalt-nickel-chromium alloy or other known alloys, simultaneous on both sides of the disk and typically by a plasma sputtering operation. Each disk plug main body part has a knob extending therefrom so that the disk and overall plug can be inserted and removed from the carrier by hand or robot.

As seen in U.S. Pat. No. 4,735,540, also an invention of Messrs. Allen and Tu Chen, a robot may be employed to remove a blank disk from a cassette by a pair of robot arms with robot fingers grasping the opposed plug knobs of a previously inserted two-part plug, transporting it to the carrier for insertion therein, inserting the plugged disk into the carrier, and after the magnetic media is applied to the plugged disks in the carrier, removing the disk and plug together from the carrier, transporting the assembly to a receiving cassette and unplugging the plug halves from the finished disk after it has been inserted into the finished disk cassettes.

While the above-described carrier, two-part plug and robotic system has been successfully used in magnetic media disk commercial production, it has been found that the plugging and unplugging action incident to the use of the two-part plugs generates minute (typically from about 01. to about 10 micron) particles which can become deposited on the disk and cause magnetic defects on the disk. Further, the plug/unplug action takes a considerable amount of time thereby increasing the manufacturing cycle time, decreasing the productivity of the very expensive plasma sputtering system and increasing manufacturing time and costs. Further, a fairly complicated robotic system was necessary to remove a disk blank from a cassette before plugging could take place with plug parts entry from both sides of the disk involving two sets of robotic arms working in unison. All of these substantial mechanical movements also will generate additional minute particles and thus more potential magnetic defects in the finished disks, all with an impact on productivity and a resultant greater cost of manufacture.

SUMMARY OF THE INVENTION

The invention utilizes a plug of one-piece construction which requires no plugging/unplugging action between plug halves. One end effector attached to one robot arm can directly hold a plug, insert it into a disk center hole in a disk cassette, remove the disk by means of the plug from that cassette, transport the disk to the carrier, place the disk and plug into the carrier, release the plug and, after the sputtering cycle is completed, the end effector is reengaged with the plug, removes the finished disk from the carrier and transports the finished disk to a finished disk cassette, unloads the finished disk into the cassette and still carrying the plug returns to the blank disk cassette to pick up another blank disk for delivery to the carrier and the next plasma deposition process cycle.

The absence of any plugging/unplugging of plug halves prevents particle generation by the rubbing surfaces and substantially reduces the defects in the manufactured magnetic media disks. Essential no rubbing or friction is present since effector-to-plug surface contact is in the form of a grab action only and plug-to-disk and disk-to-carrier contact is in the form of a direct perpendicular controlled drop or controlled pick-up without any transverse rubbing of contacting surfaces.

Further, due to the deletion of the plugging/unplugging of plug halves and the simplification of the robotic system, the overall costs are decreased and the cycle times shortened increasing productivity of both the robotic system and the plasma sputtering system. No special disk lifting devices at the cassette station are necessary as are present in the U.S. Pat. No. 4,739,540 patented system.

The herein disclosed single one-piece plug item (1) simplifies the robotic system itself, (2) reduces magnetic defects in the finished magnetic disk manufactured product and (3) increases the spread of robotic loading. It also reduces production maintenance costs since only a one-part plug and a more simple robot, robot arm and cassette system need to be cleaned. The plug itself is appreciably less costly to manufacture since it is a single machined part, not necessitating the manufacture and assembly of the multiple parts (5 or 7 pieces) as in the magnetic plug of the U.S. Pat. No. 4,634,512 patent. Additionally, due to the robotic system simplification the mean time between failures (MTBF) of the robotic workcell (downtime) is appreciably reduced.

The one-piece disk aperture closure plug of the invention is characterized by a unitary one-piece member having a relatively flat disk-like entry portion of a first diameter suitable for insertion through the disk central aperture and a relatively flat flange portion having a second diameter greater than the first diameter and greater then than the disk aperture diameter for sealing off one side of the disk around the central disk aperture. An integral cylindrical connecting portion is formed between the entry portion and the flange and has a third diameter less than the entry portion first diameter forming a circular slot between the entry portion and the flange portion. The slot has a width slightly larger than the inner peripheral edge width of the disk central aperture and engages that edge either at the bottom of the aperture when the plug is resting in the aperture or at the top of the aperture when the plug is being picked-up and moved by a robot effector.

Means preferably in the form of a knob extends outwardly from the flange portion for grabbing by a plug grabbing device such as the robot effector for insertion and removal of the plug into and from the central disk apertures. The single knob thus operates as a temporary handle for transporting a disk blank from a disk blank cassette to the carrier, inserting the disk therein, removing the disk from the carrier, transporting the disk from the carrier and inserting the disk into a finished disk cassette. When the plug is resting in the bottom of the disk aperture the entry portion seals all but a small crescent of the opposed (back) surface of the disk aperture. Magnetic media plasma during plasma sputtering operations however is prevented from accessing the front side of the disk (the side from which the plug knob extends) by the underside of the plug flange portion facing the disk aperture. Access is also prevented in the embodiment having a symmetrical entry portion. Plasma which enters into the crescent and which sticks to the plugs normally necessitates cleaning of the plug before reuse.

BRIEF DESCRIPTION OF DRAWING

FIG. 1 is a front elevational view of a prior art carrier for holding disk blanks while magnetic media is applied thereto.

FIG. 2 is a plan view of a prior art apertured magnetic media disk.

FIG. 3 is a perspective view of the unitary one-piece plug of the invention.

FIG. 4 is a side view of a vertically positioned disk and a flanged end of the plug abutting one side of the disk around the central aperture.

FIG. 5 is a cross-sectional view of the plug/disk aperture interface taken on the line 5—5 of FIG. 4 and phantomly showing a robot arm and effector being removed from the plug, the plug shown as sealing the disk aperture.

FIG. 6 is a side view of a vertically positioned disk and an entry portion end of the plug partially abutting the other side of the disk around the disk aperture.

FIG. 7 is a cross-sectional view of the plug/disk aperture interface when the robot effector is lifting and transporting a disk and plug.

FIG. 8 is a side view of the carrier and a plugged disk movable by robotic arm into and out of a carrier aperture.

FIG. 9 is a cross-sectional view of a prior art cassette with a disk and plug of the invention poised for robotic placement of a finished disk into the cassette or showing removal of a blank disk from the cassette by the plug attached to a robotic effector.

FIG. 10 is a perspective view of the prior art cassette showing the plug of the invention resting in an apertured disk.

FIG. 11 is a side elevational view of an offset second embodiment of the one-piece plug.

DETAILED DESCRIPTION

FIG. 1 illustrates a prior art disk carrier which is to be loaded with a number of disks, openings 22 being provided for six disks in the carrier shown. Each opening has a groove 28 into which an arc of a bottom peripheral edge of a disk is mounted. An arc of an upper peripheral edge of the disk rests against a rear surface 24 formed by an upper arc recess 23 extending over about 180° of the opening 22. FIG. 2 illustrates a typical, prior art disk 10 which is to be plasma coated on both sides as it lies vertically in the grooves 28 and rests against surface 24 in the carrier 20. The carrier is positioned vertically in a closed plasma chamber and exposed to a plasma of magnetic media which impinges on and coats the disk opposed surfaces. Each disk has a central circular aperture 11 which in magnetic disk operational use is positioned on a disk drive spindle (not shown). A large majority of the radial extent 12 of the disk is dedicated for data storage and retrieval. A small radial band 14 surrounding the aperture 11 is undedicated and can be covered by a central sealing plug as shown in U.S. Pat. No. 4,634,512.

FIG. 3 illustrates the unitary one-piece construction of the plug of this invention. The plug 30 has an entry potion 31 of a first diameter slightly less than the 2.54 cm diameter of the disk central aperture. Typically the diameter of the entry portion is 2.44 cm. The plug further has a flange portion 32 of a second diameter, typically 2.78 cm, greater than the diameter of the entry portion 31 and the disk central aperture 11. An integral grab means preferably in the form of a knob 35 extends distally from the flange in a direction opposite from the plug entry portion. A cylindrical interconnect portion 33 having a third diameter, typically 2.26 cm, smaller than the entry portion first diameter forms a cylindrical slot 34 extending completely around the plug. The slot 34 typically has a width of 0.82 cm which permits a portion of a lower or upper peripheral edge of the disk 10 around the central aperture of the disk to seal in the slot 34 as seen in FIGS. 5 and 7, respectively. The thickness of the disk at its central aperture edge is typically 0.125 cm.

FIG. 4 taken from the knob side of the plug shows the plug 30 positioned in a rest position in disk 10. Plug flange portion 32 seals the disk aperture 11 (shown by heavy dash lines) so that there is no opening through the aperture 11 i.e. flange portion 32 covers and blocks the entire aperture 11 as seen from the disk side illustrated. An integral knob 35 preferably extends from the flange portion forming a means by which the plug is gripped for insertion into the disk and for transporting a blank disk from a blank disk cassette to a disk processing carrier and a finished disk from the carrier to a finished disk cassette.

FIG. 5 further illustrates how the plug 30 rests on a bottom peripheral edge 11a of the central aperture 11 of disk 10. In the time instant illustrated, a robot arm 40, having an effector in the form of a pair of pivoted grip members 41 and 42 operable by a push-pull solenoid 43 of conventional construction, such as a Model PHD manufactured by Barry Wright, Inc., has mounted the plug in the disk aperture, has manipulated the plug so it rests in the disk aperture and the grip numbers have been retracted. The robot arm may be guided into proper alignment with the plug by a guide probe 43a affixed to the robot arm which inserts itself within an open cylindrical cavity 35a in knob 35. Arrows 44 illustrate the retraction movement of the grip members from the plug knob 35. The bottom arc of plug slot 34 rests on the disk peripheral edge 11a while an upper arc portion 39 of flange portion 33 abuts an arc of the flat surface of the disk surrounding the aperture 11 in the indicated undedicated region 14 of the disk (FIG. 2). The center of gravity 38 of the plug 30 is within the entry portion more particularly centrally inwardly of a bevelled rim 36 and a flat outer surface 37 extending along the distal end of the plug opposite the knob end. Such positioning of the center of gravity causes the plug to tend to lean into the disk surface particularly at the top upper edge 39 of flange portion 32. This keeps the plug from falling out from the front side (FIG. 4) of the disk as the plug sits in the vertical disk and the disk sits in the vertical carrier.

FIG. 6 shows the rear side of the disk and plug. Due to the drop placement of the plug slot 34 into the disk aperture bottom edge arc 11a (FIG. 5) a crescent-shaped opening 31a will appear at the top of entry portion 31 immediately above the upper outer peripheral arc of the bevel portion 36. While this crescent-shaped opening on the far side of the disk will permit some magnetic media entry during plasma coating of the plugged disk in the carrier 20, the underside of the plug flange portion 32 adjacent top portion 39 of the flange portion will seal off cross-talk of the plasma and magnetic media to the opposite side of the disk. Build up of material on all parts of the plug is basically the same. Texturing the plug surface prior to usage helps prevent flaking.

After the disk 10 has been coated the robot arm 40 is again moved to the carrier and the end effector grab arms 41 and 42 actuated to grasp knob 35 as seen by arrows 45 in FIG. 7. The robot arm is moved vertically upward (arrow 46) which simultaneously moves the plug 30 upwardly (arrow 47) so that the top of plug slot 34 is captured by an arc 11b of the central aperture edge of disk 10. The disk and plug combination can then be lifted by further robot arm movement from the groove 28 (FIG. 1) in the carrier and transported to a finished desk cassette for storage, inspection and shipping The angle between a tangent of the peripheral end of the entry portion at one side of slot 34 and the surface of the flange portion forming an opposite side of slot 34 is preferably greater than 90°, and more particularly 93°. This is seen in the circled area of FIG. 7. FIG. 8 illustrates the in and out movement (arrows 50) of the disk/-plug combination into carrier 20.

FIG. 9 illustrates the unloading of a blank disk from a blank disk cassette 60 or the loading of a finished disk into a finished disc cassette. Each cassette normally is of the exact same design and function interchangeable as either a blank disk cassette or a finished disk cassette. The cassette 60 is a commercially available cassette manufactured by Empak Inc. and is made of molded polycarbonate plastic. The cassette has a series of side grooves 61 for reception of the outer peripheral edges of the disks and open U-shaped ends 62. The robot arm 40 with a plug held by the rotor effector may enter the cassette through the left hand open end (FIG. 10) and in seriatim insert a held plug into the aperture of each blank disk. The plug slot is captured within the aperture edge (as in FIG. 7) and the disk/plug combination lifted from the cassette as indicated by the top end of arrow 51 and transported to the carrier (FIG. 8). After release of the disk/plug combination in the carrier the robot arm grasps another plug by its knob 35 and returns to insert that plug and pick-up and remove the next disk 10' from the blank cassette. The cycle repeats so that the robot arm then picks up and removes disk 10''. The disks are picked up and removed from left-to-right as illustrated but the plugs and disks pick-up can proceed right-to-left if desired. There is no need for any auxiliary mechanisms for pushing disks out of cassette slots as in the prior art system.

When cassette 60 is functioning as a finished disk cassette the cassette is loaded right-to-left with the first finished disk loaded into the right-most slot 61x so that the robot arm can be moved downwardly after the finished disk has been fully captured by slot 61x so that plug slot 34 is no longer captured by the disk aperture upper edge and the plug entry portion is free to be moved laterally out of the disk aperture. The robot arm and the held plug can then go direct to a blank disk cassette for picking up a new blank disk or go to a cleaning station for removing any plasma media adhered to the plug.

FIG. 10 illustrates the removal of blank disks 10a, 10b, . . . 10x from the blank disk cassette starting with disk 10a or the refilling of cassette 60 by finished disks starting with disk 10x and finishing with disk 10a. FIG. 10 omits the robot arm which would be present gripping the knob 35 of plus 20 for removal of a blank disk or for delivery and leaving of a finished disk per se. Plugs are not left in a disk as the disk sits in a cassette.

FIG. 11 illustrates an offset embodiment of a unitary one-piece plug 70 in which in one orthogonal direction the entry portion 72 is offset from flange 72 and knob 75, i.e. the axis 77 of the entry portion is displaced from the knob and flange axis 76. Thus results in the flange 72 having an upper distal end 79 which covers a greater portion of the upper end of the undedicated band 14 (FIG. 2) when the plug slot 73 rests in the disk aperture and when the disk rests in the carrier. This embodiment thus serves to more assure proper location and isolation 90 that the crescent passage from the rear side of the disk aperture is blocked by the distal end 79 of the flange. There is no cross-contamination of the disks from one side-to-another in the plasma chamber during media coating of the opposed disk surfaces.

The above description of embodiments of this invention is intended to be illustrative and not limiting. Other embodiments of this invention will be obvious to those skilled in the art in view of the above disclosure.

We claim:

1. A robotic disk handler system comprising:

a carrier panel;

aperture means in said carrier panel for mounting a series of blank disks in said carrier panel, each of said disks having a circular central aperture;

a one-piece central plug for temporarily closing the central aperture and for holding each said disk;

a first disk cassette for holding unprocessed blank disks;

a second disk cassette for receiving processed disks;

first means for inserting an entry first portion on one side of said plug into the central aperture of a blank disk from one side only of said disk, said plug including a flange having a diameter greater than the diameter of said disk central aperture;

first robotic arm means grippable on a second portion of said plug on an opposite side of said plug for transporting and inserting successive ones of said blank disks from said first disk cassette into said carrier panel;

said plug having a cylindrical portion between said entry first portion and said flange for seating on an edge portion of said disk central aperture when said robotic arm means is not gripping said plug and when said disk in said carrier is being process coated with a data storage media;

second means grippable on said second portion of said plug for removing a processed disk from said carrier panel and transporting the processed disk to said second disk cassette;

third means for inserting the processed disk into said second disk cassette; and wherein said third means removes said plug from said disc central aperture and from said one side only of said disc, such that said disc without a plug remains in said second cassette.

2. The system of claim 1 wherein said second means includes said first robotic arm means.

3. The system of claim 1 wherein said third means includes said first robotic arm means.

4. The system of claim 1 wherein said second means and third means each include said first robotic arm means.

5. The system of claim 1 wherein said plug second portion includes a knob on a distal end opposite the plug entry first portion, said first robotic arm means being grippable on said knob for transporting a blank disk and a processed disk.

6. The system of claim 1 in which said third means further functions for removing said plug from a processed disk and for returning said plug for attachment to another blank disk in a first disk cassette.

7. A method of manufacturing a data storage disk having a central aperture comprising:
providing a carrier panel having a series of spaced apertures for mounting a series of blank disks therein;
providing a first disk cassette for holding unprocessed blank disks;
placing by a robotic arm a one-piece plug including a flange into a disk central aperture of a disk from one side only of said disk in the first disk cassette;
abutting the flange against a disk wall surrounding the disk central aperture;
lifting and removing by the robotic arm said plug along with the disk from the first disk cassette;
transporting and inserting by the robotic arm successive ones of said blank disk and associated ones of said plugs from said first disk cassette to said spaced aperture of said carrier panel in seriatim, each of said plugs having a cylindrical portion between an entry portion insertable into a spaced aperture of said carrier panel and the plug flange;
seating the plug cylindrical portion on an edge portion of the aperture of said carrier panel;
removing the robotic arm from said plug;
coating both sides of the disks in the carrier panel with a data storage media;
removing the plug and an associated then-coated processed disk from said aperture of said carrier panel by gripping said plug and moving said plug and the then-coated processed disk by the robotic arm;
transporting by the robotic arm each coated processed disk and associated plug to a second disk cassette for receiving coated processed disks;
inserting the coated processed disk into the second disk cassette; and
removing the plug by the robotic arm from said one side only of the coated processed disk.

8. The method of claim 7 further including returning the plug by the robotic arm to another blank disk in a first disk cassette.

9. The method of claim 7 in which said coating step comprises exposing the disks to a plasma of magnetic media.

* * * * *